(12) United States Patent
Tseng

(10) Patent No.: US 7,199,008 B2
(45) Date of Patent: Apr. 3, 2007

(54) MICROELECTRONIC DEVICE HAVING FLOATING GATE PROTECTIVE LAYER AND METHOD OF MANUFACTURE THEREFOR

(75) Inventor: Shih der Tseng, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 330 days.

(21) Appl. No.: 10/853,455

(22) Filed: May 25, 2004

(65) Prior Publication Data

US 2005/0263816 A1 Dec. 1, 2005

(51) Int. Cl.
*H01L 21/336* (2006.01)

(52) U.S. Cl. ..................... 438/257; 365/182

(58) Field of Classification Search ........... 438/257, 438/258, 560, 564, 651, 652; 365/182, 185
See application file for complete search history.

(56) References Cited

U.S. PATENT DOCUMENTS 5,045,488 A * 9/1991 Yeh ..................... 438/257
5,196,367 A 3/1993 Lu et al.
5,652,161 A 7/1997 Ahn
5,824,584 A 10/1998 Chen et al.
6,166,409 A 12/2000 Ratnam et al.
6,284,596 B1 9/2001 Sung et al.
6,344,386 B1 * 2/2002 Io ..................... 438/238
6,395,592 B1 5/2002 Wu
6,420,232 B1 7/2002 Wu
6,552,386 B1 4/2003 Wu
2002/0102793 A1 8/2002 Wu
2002/0145162 A1 * 10/2002 Kamada et al. ............ 257/316

FOREIGN PATENT DOCUMENTS

JP 02002299477 A * 10/2002

* cited by examiner

*Primary Examiner*—Phuc T. Dang
(74) *Attorney, Agent, or Firm*—Haynes and Boone, LLP

(57) ABSTRACT

A method of manufacturing a microelectronic device including forming a memory cell having a floating gate located over a substrate, a dielectric layer over the floating gate, and a control gate located over a portion of the dielectric layer, wherein a portion of the dielectric layer is laterally disposed from the control gate. A protective layer is formed over the control gate and the dielectric layer. A mask having an opaque portion over the dielectric layer portion and an opening over the control gate is provided, and the protective layer is patterned employing the mask.

11 Claims, 5 Drawing Sheets

MICROELECTRONIC DEVICE HAVING FLOATING GATE PROTECTIVE LAYER AND METHOD OF MANUFACTURE THEREFOR

BACKGROUND

The present disclosure relates generally to microelectronic devices and, more specifically, to a microelectronic device having a floating gate protective layer and a method of manufacture therefor.

Damage to the floating gate of flash memory devices may be caused by a variety of sources, including process conditions, product handling and other environmental conditions. For example, electrical charge may breakdown thin insulating layers in the flash memory devices resulting in catastrophic damage to the floating gate. This type of damage may be a result of electrical charge accumulation during the plasma etch, wherein charge may accumulate proximate the insulating layers and cause dielectric breakdown.

Accordingly, what is needed in the art is a device and method of manufacture thereof that addresses the above-discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
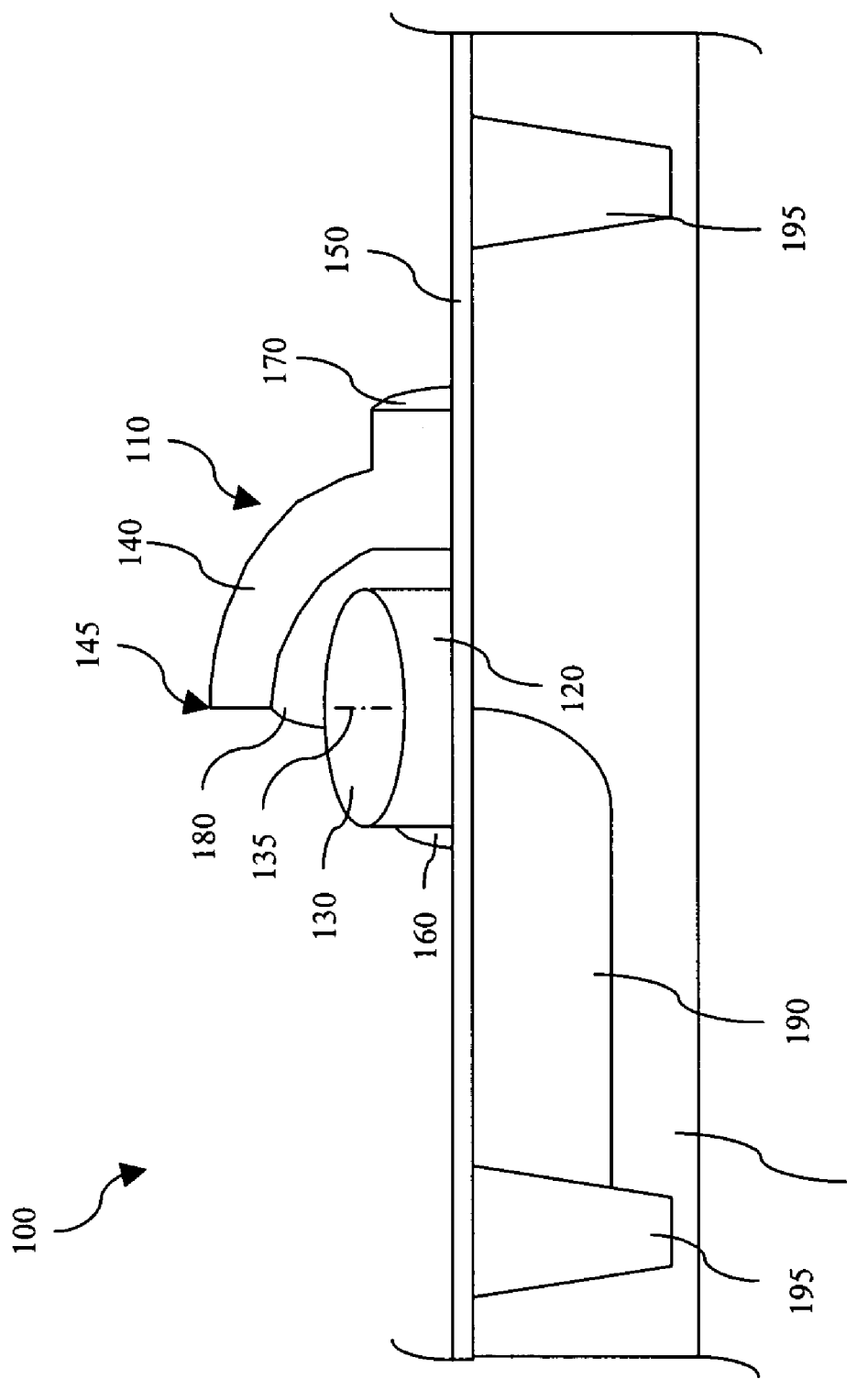
FIG. 1 illustrates a sectional view of one embodiment of a microelectronic device in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a microelectronic device 100 in an intermediate stage of manufacture according to aspects of the present disclosure. The microelectronic device 100 includes a memory cell 110 having a floating gate 120 located over a substrate 105, a dielectric layer 130 located over the floating gate 120, and a control gate 140 located over a portion of the dielectric layer 130. A portion of the dielectric layer 130 is also laterally disposed from the control gate 140. An insulation layer 150 may interpose the floating gate 120 and the substrate 105. In the illustrated embodiment, the memory cell 110 also includes a spacer 160 adjacent the floating gate 120 and the insulation layer 150, a spacer 170 adjacent the control gate 140 and the insulation layer 150, and an inter-poly layer 180 interposing the control gate 140 and the dielectric layer 130.

The substrate 105 may be a silicon-on-insulator (SOI) substrate and/or may comprise silicon, silicon germanium, gallium arsenide, diamond, strained silicon, sapphire and/or other materials. The substrate 105 may also include one or more doped regions or wells 190 doped with boron or another p-type dopant and/or phosphorous or another n-type dopant. In one embodiment, the substrate 105 comprises diamond and includes p-type regions doped with boron and n-type regions doped with deuterium-boron complexes. Such n-type regions may be formed by treating boron-doped regions with a deuterium plasma to provide deuterium-boron complexes.

In the illustrated embodiment, the microelectronic device 100 also includes one or more isolation regions 195 located in the substrate 105. The microelectronic device 100 may be electrically isolated from neighboring devices by the isolation regions 195. The isolation regions 195 may be formed by etching or otherwise forming a trench or other recess in the substrate 105 and subsequently filling the recess with a dielectric material, such as by thermal oxidation, rapid thermal oxidation, chemical vapor deposition (CVD), atomic layer deposition (ALD), plasma enhanced chemical vapor deposition (PECVD), local oxidation and/or other processes. Alternatively, local oxidation of silicon (LOCOS) may be employed to form the isolation regions 195. In one embodiment, the isolation regions 195 are shallow trench isolation (STI) regions.

The memory cell 110 may be a non-volatile device, such as an erasable programmable read only memory (EPROM), an electrically erasable programmable read only memory (EEPROM) and/or other non-volatile flash memory device. The aspects of the present disclosure are also applicable or readily adaptable to microelectronic devices including other types of memory cells and other microelectronic devices. Moreover, the microelectronic device 100 may include more than one memory cell horizontally disposed and/or vertically stacked relative to the substrate 105.

The floating gate 120 may comprise doped and/or undoped polysilicon, silicide and/or other materials, and may be formed by CVD, PECVD, ALD, physical vapor deposition (PVD) and/or other processes. In one embodiment, the thickness of the floating gate 120 ranges between about 100 Angstroms and about 2000 Angstroms.

The dielectric layer 130 may have a substantially oval shape, as shown in FIG. 1, such as may be the result of formation by LOCOS. The dielectric layer 130 may also comprise silicon dioxide, thermal oxide and/or other materials, and may be formed by CVD, PECVD, ALD, PVD and/or other processes. A portion of the dielectric layer 130 is laterally disposed from the control gate 140, such that an end 145 of the control gate 140 may substantially correspond to or terminate proximate a mid-point 135 of the dielectric layer 130. The dielectric layer 130 may have a thickness ranging between about 200 Angstroms and about 5000 Angstroms.

Although not limited by the scope of the present disclosure, the control gate 140 may comprise doped or undoped polysilicon or a metal silicide such as nickel silicide, tungsten silicide and other metal suicides. The control gate 140 may also be formed by CVD, PECVD, ALD, PVD and/or other processes. The control gate 140 may have a thickness ranging between about 500 Angstroms and about 10,000 Angstroms.

The insulation layer 150 may comprise diamond and/or another high-k dielectric material, including hafnium dioxide or zirconium dioxide, and may be formed by thermal oxidation, rapid thermal oxidation, PECVD, and/or other processes. In one embodiment, the insulation layer 150 may include two or more layers. For example, the isolation layer 150 may comprise a high-k material layer and a nitrided oxide layer located over the high-k material layer. The insulation layer 150 may have a thickness ranging between about 5 Angstroms and about 500 Angstroms.

The spacers 160, 170, may comprise silicon nitride, silicon dioxide and/or other insulating materials. The spacers 160, 170, may be formed by blanket deposition followed by a blanket etch-back process, such as a plasma etch, a chemical etch, chemical mechanical polishing (CMP) and/or other processes. The inter-poly layer 180 may comprise carbon dioxide or other dielectric materials, and may be formed by thermal oxidation, rapid thermal oxidation, PECVD, ALD and/or other processes.

Figure 2:
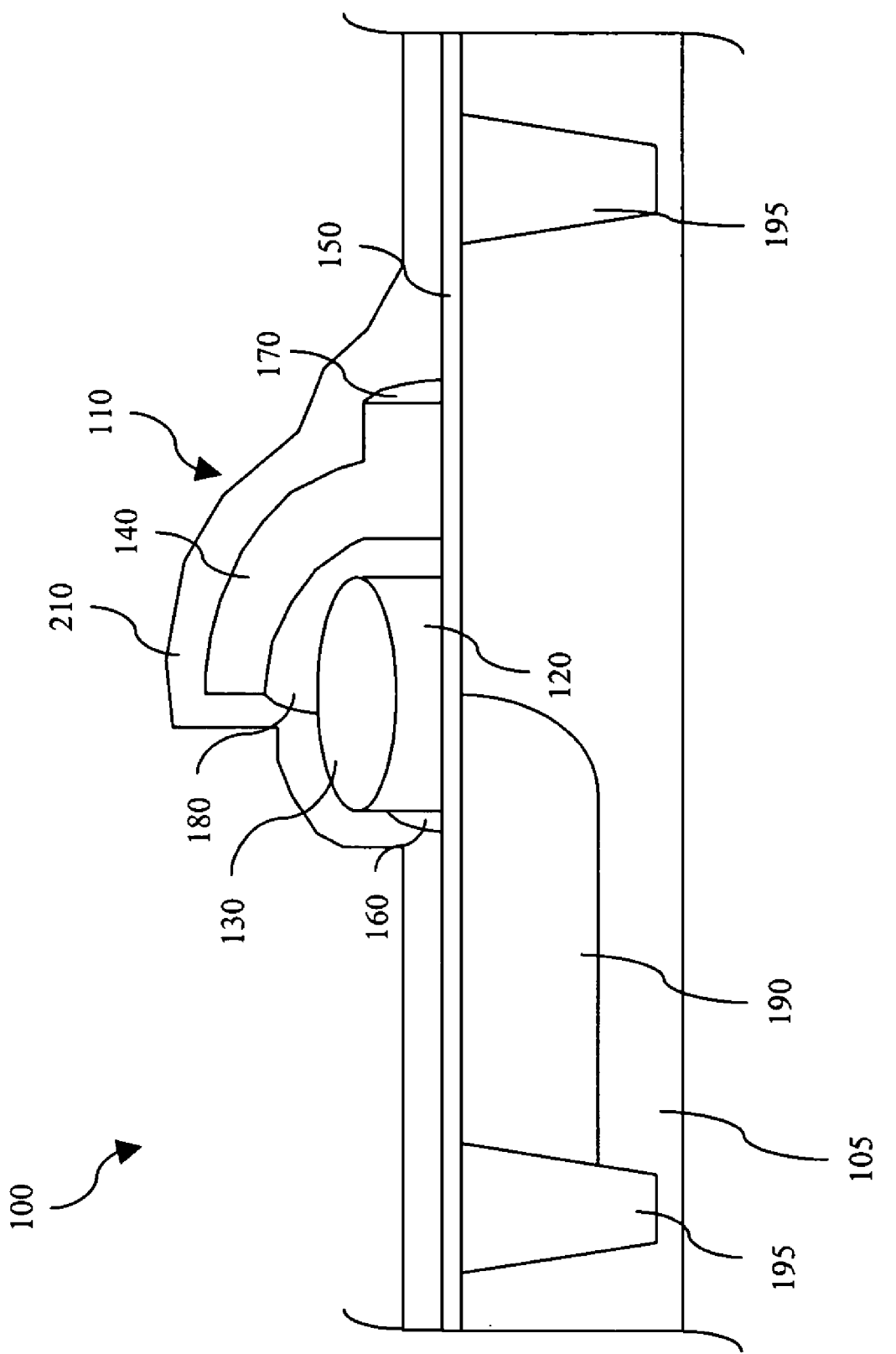
FIG. 2 illustrates a sectional view of the microelectronic device shown in FIG. 1 in a subsequent stage of manufacture according to aspects of the present disclosure.

Referring to FIG. 2, illustrated is a sectional view of the microelectronic device 100 shown in FIG. 1 in a subsequent stage of manufacture according to aspects of the present disclosure. The microelectronic device 100 may also include a protective layer 210 located over the dielectric layer 130. In the illustrated embodiment, the protective layer 210 is initially formed by a blanket deposition, thereby substantially covering the dielectric layer 130, the control gate 140 and an exposed portion of the inter-poly layer 180. Accordingly, the protective layer 210 may substantially span at least one side of the floating gate 120 that is substantially perpendicular to the substrate 105. The protective layer 210 may be or comprise $Si_3N_4$ and/or another silicon nitride, and may be formed by thermal oxidation, rapid thermal oxidation, PECVD, ALD and/or other processes. In one embodiment, the protective layer 210 is formed by selective deposition wherein the surface of the dielectric layer 130 may be treated to allow for deposition selectivity during a CVD, PECVD, or ALD process. The protective layer 210 may have a thickness ranging between about 600 Angstroms and about 12,000 Angstroms.

Figure 3:
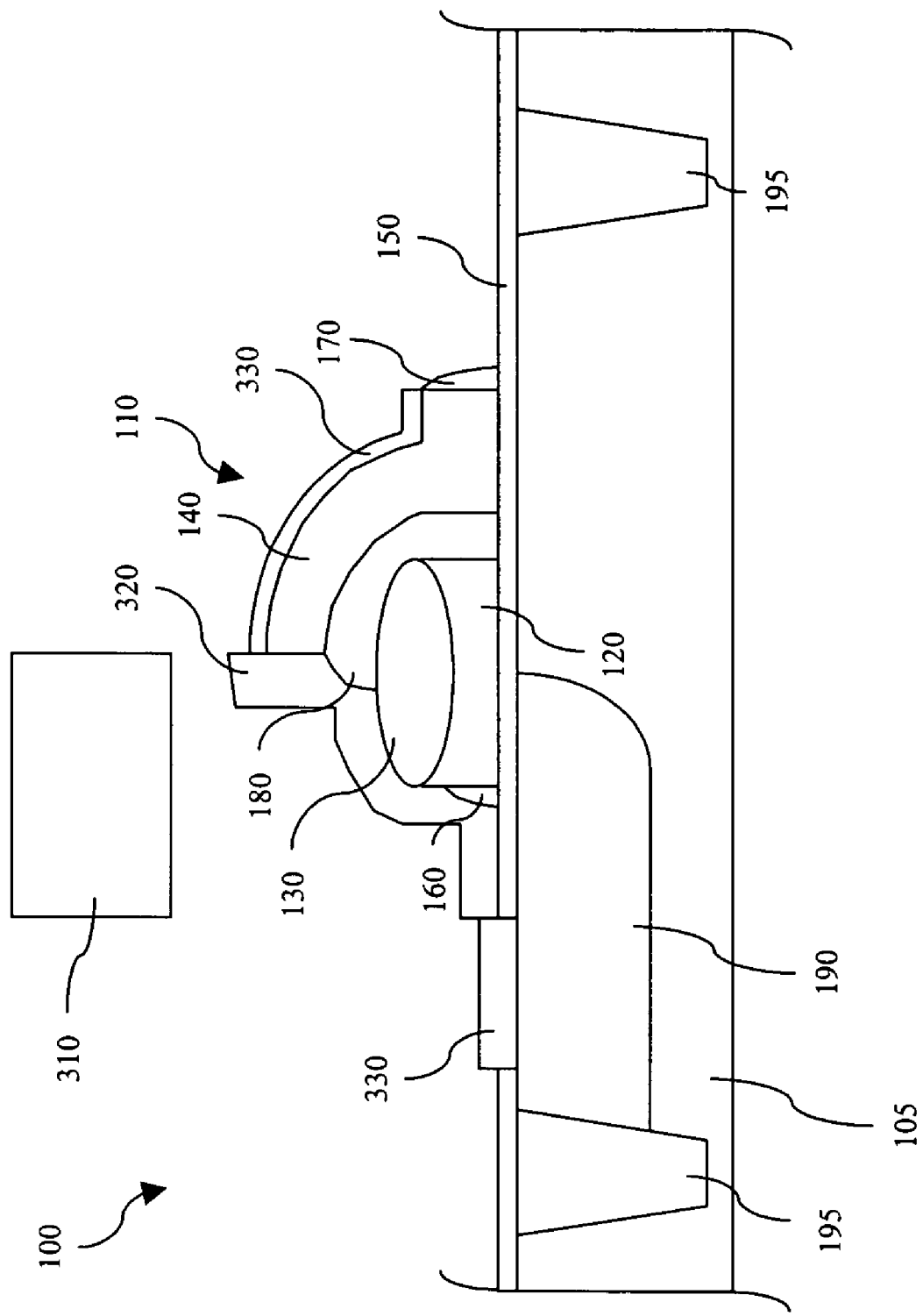
FIG. 3 illustrates a sectional view of the microelectronic device shown in FIG. 2 in a subsequent stage of manufacture according to aspects of the present disclosure.

Referring to FIG. 3, illustrated is a sectional view of the microelectronic device 100 shown in FIG. 2 in a subsequent stage of manufacture according to aspects of the present disclosure. A mask 310 formed on or otherwise located over the protective layer 210 shown in FIG. 2 may be employed to remove one or more portions of the protective layer 210, resulting in a patterned protective layer 320 and exposing the control gate 140 and at least a portion of the substrate 105 and/or the insulation layer 150. For example, the mask 310 may include an opaque portion (shown) over the portion of the protective layer 210 desired to be protected during an etching process. The mask 310 may also include an opening or transparent portion over the control gate 140 to expose a portion of the protective layer 210 to an etching process and remove such portion of the protective layer. The mask 310 may be employed during an etching process to define the patterned protective layer 320, including a chemical etching process, a dry etching process, a plasma etching process and/or other process. In one embodiment, the etching process may employ an etching chemistry comprising fluorocarbons, perfluorocarbons, $CF_4$, $CF_8$, $C_3F_8$, $C_2F_8$, HBr, combinations thereof and/or other materials.

The mask 310 may comprise photoresist and/or other materials, and may be formed on or over the substrate 105 by ALD, CVD, spin-on coating and/or other processes. The mask 310 may also be thermally annealed by a process comprising exposure to radiation, such as ultra-violet light, x-ray energy, electron beam energy and/or other actinic radiation. Such exposure to radiation may chemically change the mask 310, such as in embodiment in which the mask 310 is photo-sensitive. The opaque and transparent portions of the mask 310 may be defined by a chemical or dry etch.

The patterned protection layer 320 may also be employed as a salicide or silicide block during the subsequent formation of contacts 330 for the microelectronic device 100. The contacts 330 may comprise salicide, silicide and/or other materials, and may be formed by the reaction of polysilicon or silicon with a metal, possibly at an elevated temperature.

Figure 4:
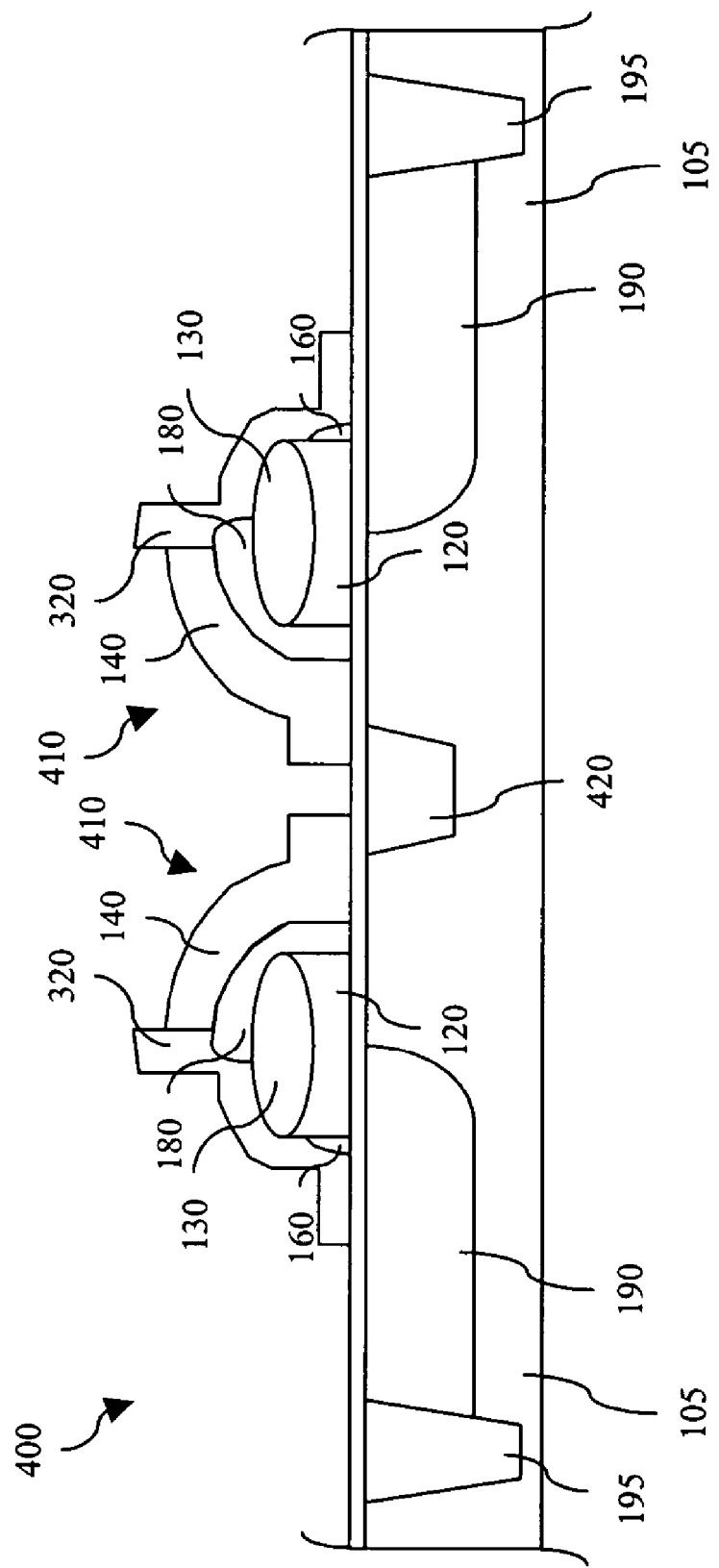
FIG. 4 illustrates a sectional view of another embodiment of a microelectronic device constructed according to aspects of the present disclosure.

Referring to FIG. 4, illustrated is a sectional view of another embodiment of the microelectronic device 100 shown in FIG. 3, herein designated by the reference numeral 400. The microelectronic device 400 may include two or more microelectronic devices 410, which may be substantially similar to the microelectronic device 100 or the memory cell 110 shown in FIG. 1. For example the microelectronic devices 410 may form a split-gate flash memory cell which may share a doped region 420 formed in the substrate 105. As with the microelectronic device 100 shown in FIG. 1, the microelectronic device 400 includes protection layers 320 over corresponding portions of the dielectric layers 130, the inter-poly layer 180 and the spacers 160, and adjacent the control gates 140.

Figure 5:
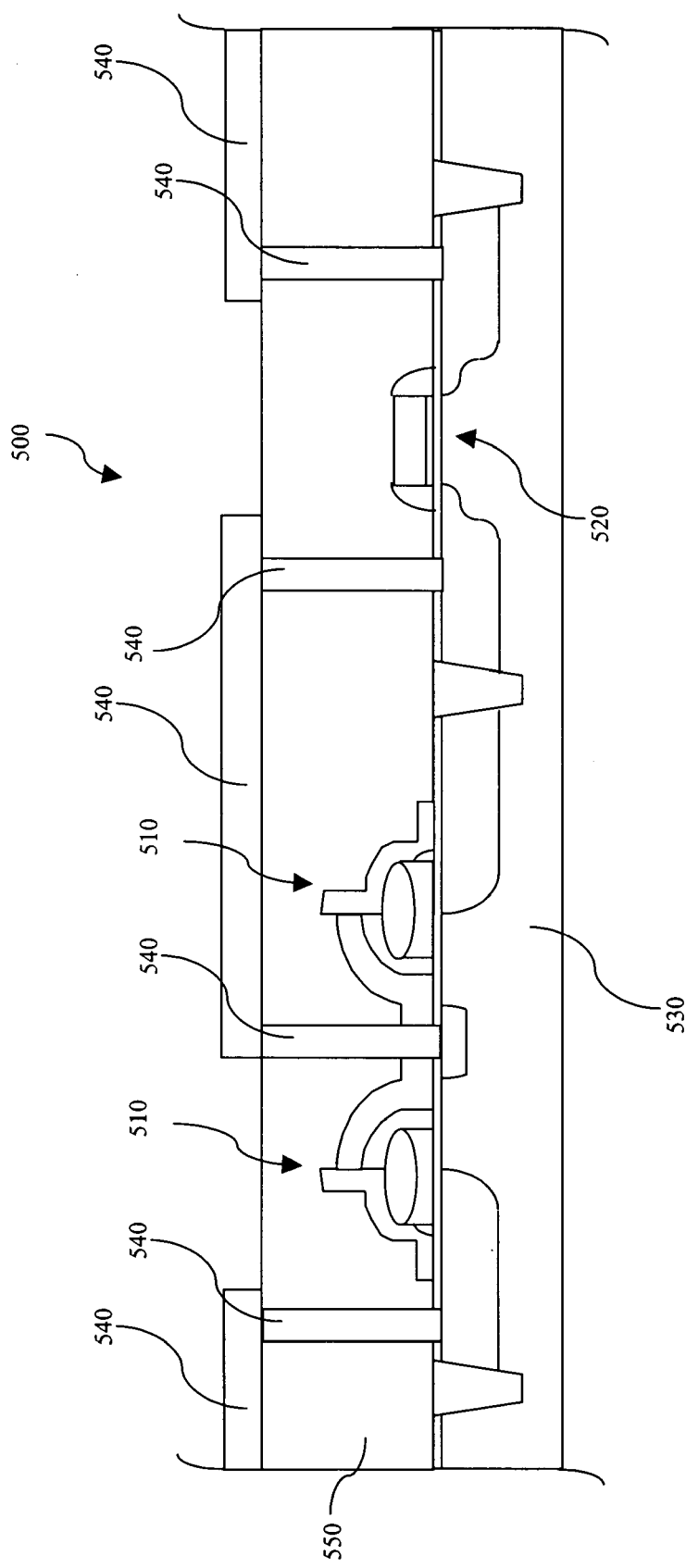
FIG. 5 illustrates a sectional view of one embodiment of an integrated circuit device constructed according to aspects of the present disclosure.

Referring to FIG. 5, illustrated is a sectional view of one embodiment of an integrated circuit device 500 constructed according to aspects of the present disclosure. The integrated circuit device 500 is one environment in which the aspects of the above-described microelectronic devices and memory cells may be implemented. For example, the integrated circuit device 500 includes a plurality of microelectronic devices 510, one or more of which is substantially similar to microelectronic device 100 shown in FIG. 1, the memory cell 110 shown in FIG. 1, the microelectronic device 400 shown in FIG. 4 and/or the microelectronic devices 410 shown in FIG. 4. The microelectronic devices 510 are interconnected and/or connected to one or more other microelectronic devices 520 manufactured on or in a substrate 530. The microelectronic device 520 may be or comprise a metal-oxide-semiconductor field-effect-transistor (MOSFET) and/or other conventional or future-developed semiconductor device.

The integrated circuit device 500 also includes interconnects 540 extending along and/or through one or more dielectric layers 550 to ones of the plurality of microelectronic devices 510. The dielectric layer 550 may comprise silicon dioxide, Black Diamond® and/or other materials, and may be formed by CVD, PECVD, ALD, PVD, spin-on coating and/or other processes. The dielectric layer 550 may have a thickness ranging between about 2000 Angstroms and about 15,000 Angstroms. The interconnects 540 may comprise copper, tungsten, gold, aluminum, carbon nanotubes, carbon fullerenes, a refractory metals and/or other materials, and may be formed by CVD, PECVD, ALD, PVD and/or other processes.

Thus, the present disclosure introduces a method of manufacturing a microelectronic device including, in one embodiment, forming a memory cell having a floating gate located over a substrate, a dielectric layer over the floating gate, and a control gate located over a portion of the dielectric layer, wherein a portion of the dielectric layer is laterally disposed from the control gate. A protective layer is formed over the control gate and the dielectric layer. A mask having an opaque portion over the dielectric layer portion and an opening over the control gate is provided, and the protective layer is patterned employing the mask.

Embodiments of a memory device are also provided in the present disclosure. In one embodiment, the memory device includes a floating gate located over a substrate, a dielectric layer located over the floating gate, and a control gate located over a portion of the dielectric layer. A portion of the dielectric layer is laterally disposed from the control gate. A protective layer is also located over the dielectric layer portion.

The present disclosure also provides a method of manufacturing an integrated circuit device. In one embodiment, the method includes forming a plurality of memory cells each having a floating gate located over a substrate, a dielectric layer over the floating gate, and a control gate located over a portion of the dielectric layer, wherein a portion of each of the dielectric layers is laterally disposed from a corresponding one of the control gates. A protective layer is formed over the control gates and the dielectric layers. The method also employs a mask having a plurality of opaque portions each located over one of the dielectric layer portions and a plurality of openings each located over one of the control gates. The protective layer is patterned employing the mask. At least one interlevel dielectric layer is formed over the plurality of memory cells, and a plurality of interconnects extends through the interlevel dielectric layer and interconnects ones of the plurality of memory cells.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a microelectronic device, comprising:
    forming a memory cell having a floating gate located over a substrate, a dielectric layer over the floating gate, and a control gate located over a portion of the dielectric layer, wherein a portion of the dielectric layer is laterally disposed from the control gate;
    forming a protective layer over the control gate and the dielectric layer;
    providing a mask having an opaque portion over the dielectric layer portion and an opening over the control gate; and
    patterning the protective layer by employing the mask, wherein patterning the protective layer employs an etching chemistry and the opaque mask portion prevents the etching chemistry from eroding the dielectric layer portion.

2. The method of claim 1 further comprising forming electrical contacts on the control gate and the substrate each adjacent the patterned protective layer.

3. The method of claim 2 wherein forming the electrical contacts employs a salicide process.

4. The method of claim 2 wherein the electrical contacts comprise silicide.

5. The method of claim 1 wherein the opaque mask portion and the control gate prevent the etching chemistry from eroding the dielectric layer.

6. The method of claim 1 wherein the protective layer comprises silicon nitride.

7. The method of claim 1 wherein the memory cell is a flash device.

8. The method of claim 1 further comprising forming a portion of the protective layer substantially spanning at least one side of the floating gate that is substantially perpendicular to the substrate.

9. A method of manufacturing an integrated circuit device, comprising:
    forming a plurality of memory cells each having a floating gate located over a substrate, a dielectric layer over the floating gate, and a control gate located over a portion of the dielectric layer, wherein a portion of each of the dielectric layers is laterally disposed from a corresponding one of the control gates;
    forming a protective layer over the control gates and the dielectric layers;
    providing a mask having a plurality of opaque portions each located over one of the dielectric layer portions and a plurality of openings each located over one of the control gates;
    patterning the protective layer employing the mask;
    forming at least one interlevel dielectric layer over the plurality of memory cells; and
    forming a plurality of interconnects extending through the interlevel dielectric layer and interconnecting ones of the plurality of memory cells;
    wherein patterning the protective layer employs an etching chemistry and the plurality of opaque mask portions prevent the etching chemistry from eroding the plurality of dielectric layer portions.

10. The method of claim 9 wherein the protective layer comprises a silicon nitride other than $Si_3N_4$.

11. The method of claim 9 wherein the protective layer comprises $Si_3N_4$.

* * * * *